United States Patent [19]

Hartemann

[11] 4,129,837

[45] Dec. 12, 1978

[54] ELASTIC SURFACE WAVE OSCILLATOR

[75] Inventor: Pierre Hartemann, Paris, France

[73] Assignee: Thomson-CSF, Paris, France

[21] Appl. No.: 812,472

[22] Filed: Jul. 5, 1977

[30] Foreign Application Priority Data

Jul. 9, 1976 [FR] France ............................... 76 21104

[51] Int. Cl.² ........................................ H03B 5/32
[52] U.S. Cl. ................................. 331/107 A; 333/72
[58] Field of Search ................... 330/5.5; 331/107 A; 333/30 R, 72

[56] References Cited

U.S. PATENT DOCUMENTS 3,845,418  10/1974  Weglein ............................... 333/72
3,950,713  4/1976   Lewis ................................. 331/107A
3,999,147  12/1976  Otto et al. ......................... 331/107 A
4,011,526  3/1977   Kinsman ............................. 331/107 A
4,025,880  5/1977   Coussot .............................. 333/72

Primary Examiner—John Kominski
Attorney, Agent, or Firm—Cushman, Darby & Cushman

[57] ABSTRACT

The invention relates to elastic surface wave oscillators using a feedback loop formed by a filter consisting of two interdigitated comb transducers. More particularly, the invention relates to a stable oscillator having a low harmonic content wherein the electrical oscillation energy is extracted by means of an auxiliary interdigitated transducer receiving a fraction of the vibratory energy exchanged in the feedback loop.

11 Claims, 3 Drawing Figures

ELASTIC SURFACE WAVE OSCILLATOR

The invention relates to electrical oscillators which comprise amplifier means associated with a feedback loop formed by an elastic surface wave transmission system. The oscillation frequency is determined by the feedback loop used as a narrow-band band-pass filter. In order to produce an a.c. voltage having a low harmonic content and of which the oscillation frequency is particularly stable, maximum allowance has to be made for the trend of the transfer function of the feedback loop, for the characteristics of the propagation medium of the elastic surface waves, for the manner in which the electrical energy is extracted, for parasitic reflections and for the undesirable effects resulting from stray electrostatic coupling or to spurious radiation by bulk waves.

By virtue of the advantages associated with manufacture, the solution most widely adopted at the present time consists in making the electromechanical transducers in the form of interdigitated comb transducers. Known elastic surface wave oscillators make use of a simple exchange of vibratory energy between two transducer combs, but unfortunately the harmonic content of the collected oscillation and the frequency stability are unsatisfactory.

In accordance with the present invention, there is provided an elastic surface wave oscillator comprising: electrical amplifier means provided with a feedback loop, said feedback loop being formed by first and second interdigitated comb transducers arranged on a major face of a piezoelectric substrate; the electrical energy supplied by said oscillator being available at the terminals of a third interdigitated comb transducer arranged on said major face for collecting a fraction of the vibratory energy emitted by said second transducer; the interdigitated combs of said first and second transducers having fingers arranged for respectively forming arrays of discrete radiator elements; the pitches of said radiator elements in said arrays being respectively equal to $k_1$ and $k_2$ times, the wavelength of said vibratory energy; $k_1$ and $k_2$ being integers respectively equal to 5 and 7.

For a better understanding of the present invention and to show how the same may be carried into effect reference will be made to the ensuing description and the following drawings, among which:

Figure 1:
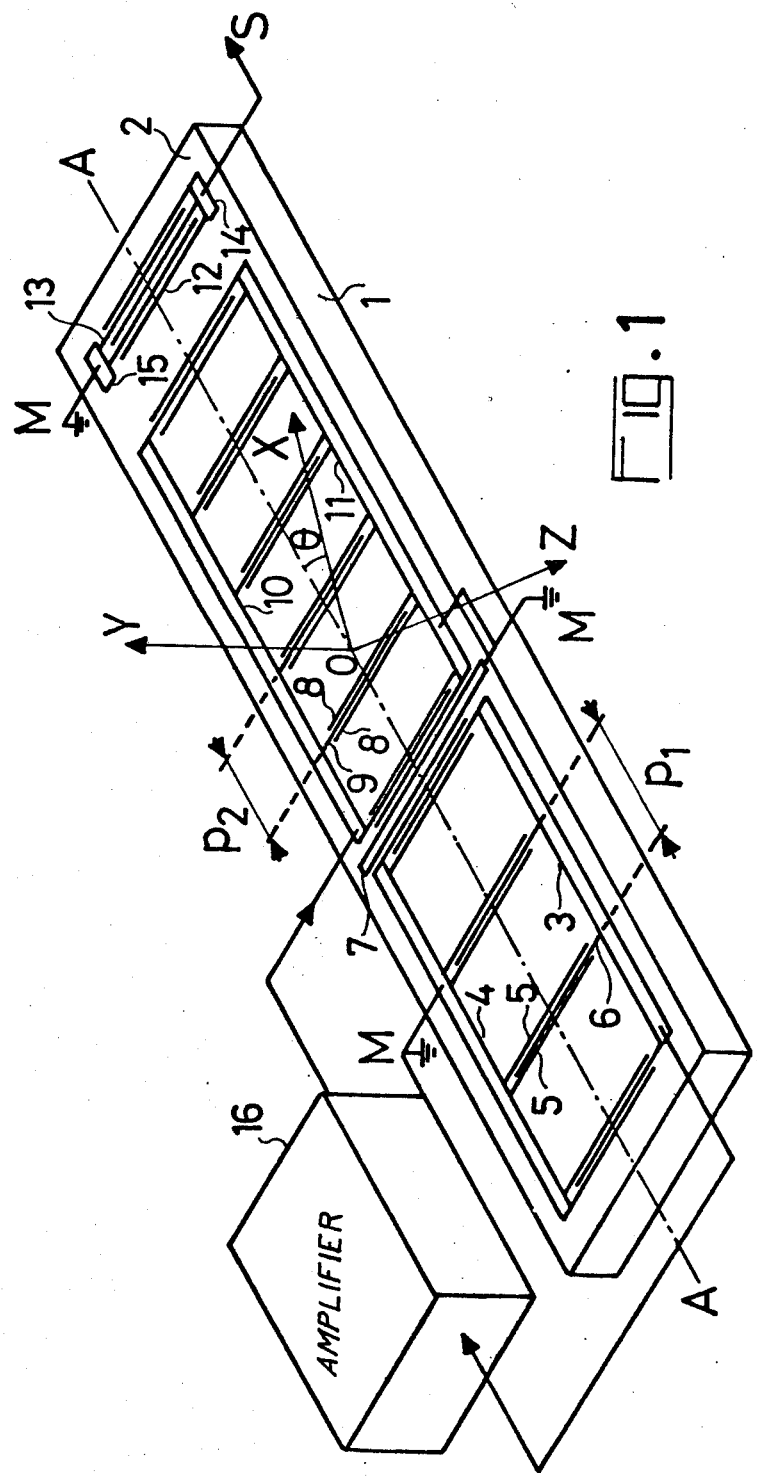
FIG. 1 shows an oscillator in accordance with the invention.

FIG. 1 shows an elastic surface wave oscillator comprising electrical amplifier means 16 the output and input terminals of which being connected to one another by a feedback loop which selectively transmits a positive feedback signal at a predetermined frequency $f_o$. The oscillator feedback loop is formed for example by cutting a thin plate 1 from a piezoelectric crystal with crystallographic axes XYZ. Arranged on the major face 2 of the thin plate 1 are two electromechanical transducers which exchange elastic surface waves that are propagated along the axis AA. The first electromechanical transducer is formed by a deposit of electrically conductive material effected in the form of two interdigitated combs. The spines of these combs are respectively formed by the conductive bands 3 and 4 and their fingers by the parallel rectilinear filaments 6 and 5. According to one well known general arrangement, the fingers 5 and 6 form a pattern of radiator intervals perpendicular to the direction of radiation AA and the spacing of the fringes delimiting a radiator interval is equal to one quarter of the wavelength $\lambda_o$ of the radiated surface waves. The wavelength $\lambda_o$ is of course deduced from the conventional formula $\lambda_o = C/f_o$ where C is the phase velocity of the elastic surface waves in the direction AA which forms an angle $\theta$ with the axis X. The second electromechanical transducer has a similar structure, i.e. two interdigitated combs of which the spines are respectively formed by the conductive bands 10 and 11 and their fingers by the parallel rectilinear filaments 8 and 9. An electrostatic shield in the form of a conductive band 7 connected to the earth M of the electrical amplifier means 16 is interposed between the first and second electromechanical transducers.

The oscillator circuit shown in FIG. 1 self oscillates with the elements which have just been mentioned, although there remains to be described the manner in which the vibratory energy is extracted. The electrical signal S delivered by the oscillator shown in FIG. 1 is not extracted at the output terminals of the electrical amplifier means 16 because the connection of an electrical charge to these terminals can have a substantial loading effect upon the tuning frequency of the oscillator. In addition, the waveform appearing at the output terminals of the electrical amplifier means is spoiled by harmonic distortion. Accordingly, the invention provides for extraction of the vibratory oscillation energy by means of a third transducer pattern in the form of interdigitated combs arranged in the extension of the two comb transducers which form part of the feedback loop. As shown in FIG. 1, this third electromechanical transducer pattern comprises, by way of non-limiting example, two interdigitated combs with spines 14 and 15 and with their rectilinear fingers 12 and 13 oriented perpendicularly of the propagation axis AA. In one preferred embodiment, the emitter combs 8, 9, 10, 11 are surrounded by the combs 3, 4, 5, 6 and 12, 13, 14, 15. By using a transducer located outside the loop causing the oscillations to be maintained, it is possible not only to obtain improved frequency stability and a far lower harmonic content of the wave delivered, but also to effect the best matching of impedance with the external electrical charge. The extra transducer delivering the electrical signal S may be in the form of a floating source and may comprise an arrangement of fingers connected in parallel, in series or in series-parallel. On the other hand, each of the fingers which form this transducer pattern may be divided in two with a distribution or spacing $\lambda_o/8$ making it possible to reduce the reflections of the elastic surface waves when they impinge on the conductive fingers. In order to conclude the general arrangements of the structure shown in FIG. 1, it is pointed out that the reflections of the elastic surface waves at the ends of the thin plate 1 may be rendered harmless either by providing damping means on the surface 2 or by forming diffusing edges by sand blasting or by cutting the ends of the thin plate obliquely relative to the axis AA. In order to overcome the parasitic signals arising out of the propagation by bulk waves, it is of advantage to sand blast the major face of the thin plate 1 oposite the face 2.

So far as the feedback loop is concerned, it is of advantage to reduce the delay in transmission by as much as possible which is equivalent to arranging the interdigitated comb transducers forming the feedback loop as close as possible to one another. The result of this is that stray electrostatic coupling has a tendency to increase between the transducer 3, 4, 5, 6 and the transducer 8, 9, 10, 11. In order to obviate this disadvantage, the invention provides several improvements.

One of these improvements consists in interposing a conductive ribbon 7 connected to earth M between the transducers so as to reduce the parasitic capacity between the conductive combs situated on either side of this electrostatic shield. The fingers 5 and 8 nearest the ribbon 7 are also connected to earth M as are the corresponding spines 4 and 11 which are not in the extension of one another.

Another improvement consists in reducing the number of fingers of the transducers without however reducing the selectivity of the feedback loop. This technique is illustrated in FIG. 1 in conjunction with the explanatory diagrams of FIG. 2. The two transducers of the feedback loop are in fact arrays of discrete radiator elements of which the respective spacings $p_1$ and $p_2$ are multiples of the wavelength $\lambda_o$ of the elastic surface waves. For an array of n discrete radiator elements with the spacing p, it is possible to define a transmission factor F(f) which is expressed by the following relation:

$$F(f) = \frac{1}{n} \frac{\sin \frac{\pi p n}{cf}}{\sin \frac{p}{cf}}$$

which c is the phase velocity of the elastic surface waves and f is the frequency of the propagated vibration.

If the spacing p of the radiator elements is equal to k times the wavelength $\lambda_o$ which corresponds to the central frequency $f_o$ of the transmission band of a radiator element, it can be seen that the above relation may be written as follows:

$$F(\frac{f}{f_o}) = \frac{1}{n} \frac{\sin \pi k \frac{f}{f_o} n}{\sin \pi k \frac{f}{f_o}}$$

with $p = k \lambda_o = k\ c/f_o$

The transfer function of the feedback loop may be put into the form of a product of several factors. So far as selectivity is concerned, the two determining factors are given by the preceding relation.

Figure 2:
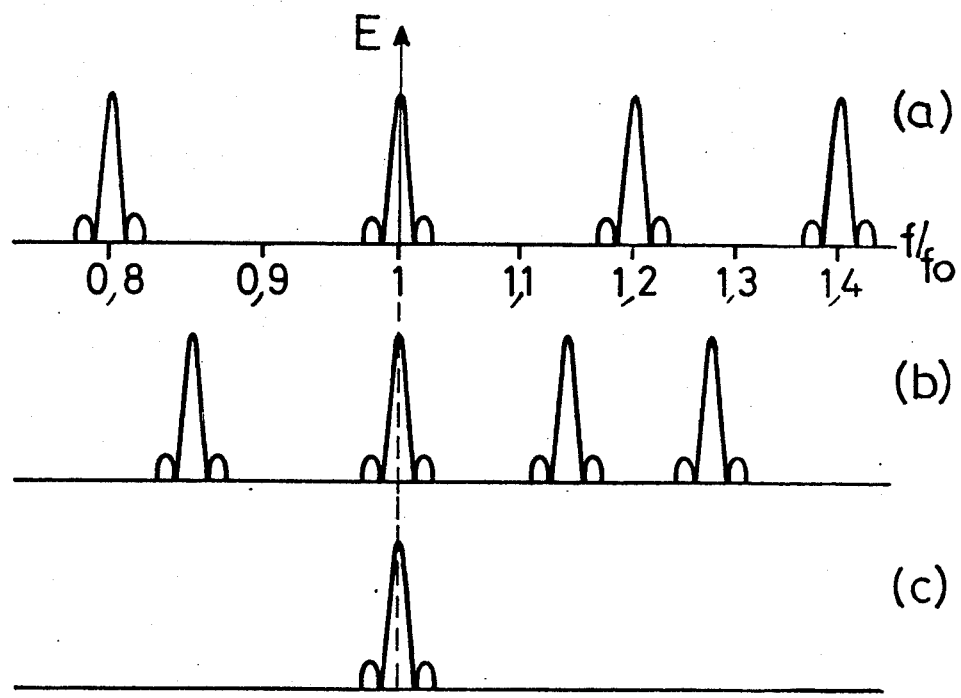
FIGS. 2 and 3 are explanatory diagrams.

The diagrams of FIG. 2 have been drawn by fixing the spacing $p_1$ to 7 $\lambda_o$ and the spacing $p_2$ to 5 $\lambda_o$. The frequency response shown at (a) is characteristic of the transducer 8, 9, 10, 11, whilst the frequency response shown at (b) relates to the transducer 3, 4, 5, 6. The global frequency response is given at (c) and comprises a single very narrow transmission band. Accordingly, providing the spacings $p_1$ and $p_2$ are respectively selected equal to $k_1 \lambda_o$ and to $k_2 \lambda_o$, with $k_1$ and $k_2$ respectively equal to 7 and 5, it is possible to form a feedback loop which has only a single very narrow transmission band. The reduction in the undesirable electrostatic coupling is even greater if care is taken to form each radiator element by a single finger 6 or 9 bordered by two fingers 5 or 8 connected to earth M. Under the effect of pulsed excitation, this particular arrangement of the fingers provides a full wave vibratory oscillation emitted at each radiator element. The electrical field attenuates very rapidly with increasing distance from the radiator elements because the radiator elements are formed by two substantially merged phase-opposed dipoles. It is pointed out that the measures taken to limit the electrostatic coupling are also beneficial in limiting the reflections undergone by the elastic surface waves on encountering the fingers of the combs because these fingers are fewer in number.

So far as the output transducer outside the feedback loop is concerned, it is possible to adopt a configuration which, although of limited extent, is sufficient effectively to reduce the level of the harmonics 2, 3, 4 et seq which the elastic surface wave generated by the oscillator may contain.

In the foregoing, reference has been made to the measures by which it is possible to obtain a pure sine output wave with a frequency that is stable with regard to the load variations of the oscillator. The stability of the oscillation frequency with respect to the operating temperature is ensured by a suitable choice of the thin plate 1.

When the stability required is moderate, the thin plate 1 may be made of lithium niobate because this crystalline material is commonly used in the field of elastic surface wave structures.

For applications requiring a particularly stable oscillation frequency, it is better to use quartz.

Figure 3:
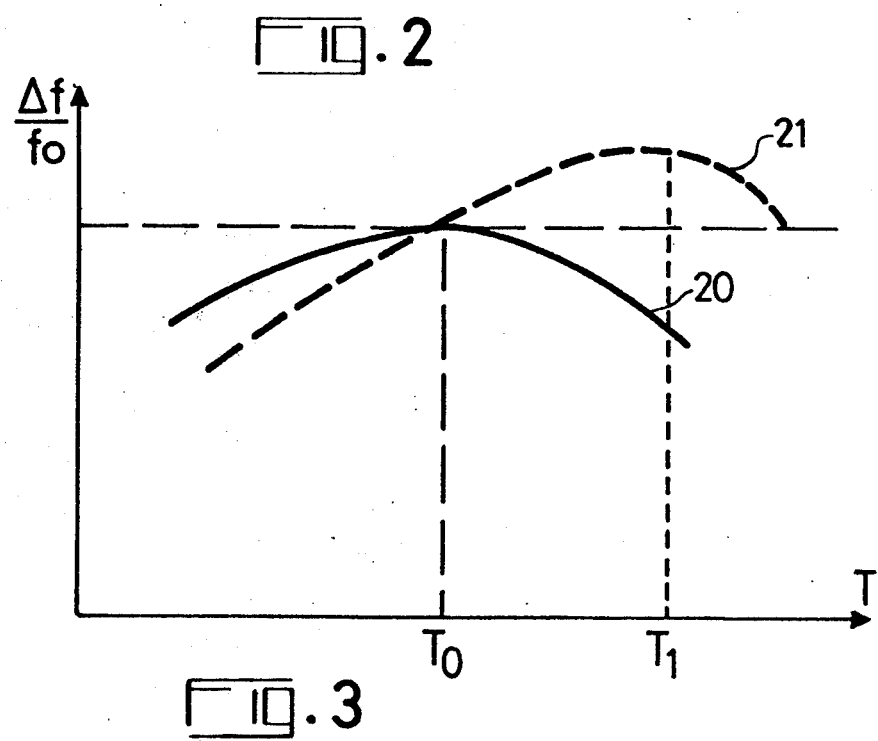

FIG. 3 shows temperature drift curves relating to the Y cut of quartz. The operating temperature T is recorded on the abscissa and the relative value $\Delta f/f_o$ of the frequency drift observed on the ordinate.

The curve 20 culminates at the temperature $T_o$ and, for the Y cut of quartz, represents the thermal drift which is obtained for an angle $\theta$ of 33° of the direction of propogation with the axis X (see FIG. 1). The temperature $T_o$ is around 20° C. and the first-order term of the thermal drift is zero. The second-order term of the thermal drift is 2.2 times lower than when the ST cut of quartz is adopted.

In cases where it is contemplated enclosing the oscillator in a thermostatic chamber, it is advisable for the culminating point of the thermal drift curve to be situated at a higher temperature level. The Y cut of quartz may be used with advantage to this end, as shown by the curve 21 in FIG. 3.

In order to obtain the temperature drift characteristic illustrated by the curve 21, a thin plate of quartz is cut along the Y cut and the surface propagating the elastic surface waves is subjected to a treatment by ion implantation which superficially modifies the regular arrangement of the atoms. By way of non-limiting example, a thin plate of Y cut quartz may be subjected to an ion bombardment by means of light atoms of helium. By adjusting the accelerator potential to 95 kV and by fixing the dose to 1.5 $10^{16}$ He$^+$/cm$^2$, the implantation is sufficient for surface waves propagated at an angle $\theta$ of 35° relative to the axis X to be able with an oscillation frequency of 107 Mc/s to lead to the drift curve 21 which culminates at the temperature of 80° C.

What I claim is:

1. An elastic surface wave oscillator comprising: electrical amplifier means provided with a feedback loop, said feedback loop being formed by first and second interdigitated comb transducers arranged on a major face of a piezoelectric substrate; the electrical energy supplied by said oscillator being available at the terminals of a third interdigitated comb transducer arranged on said major face for collecting a fraction of the vibratory energy emitted by said second transducer; the interdigitated combs of said first and second transducers having fingers arranged for respectively forming arrays of discrete radiator elements; the pitches of said radiator elements in said arrays being respectively equal to $k_1$ and $k_2$ times the wavelength of said vibratory energy; $k_1$ and $k_2$ being integers respectively equal to 5 and 7.

2. An oscillator as claimed in claim 1, wherein said substrate is a thin plate of Y cut quartz; said major face being formed by one of the principal surfaces of cut of said thin plate; the direction of propagation of said elastic surface waves forming an angle substantially equal to 33° with the axis X of quartz.

3. An oscillator as claimed in claim 1, wherein said substrate is a thin plate of Y cut quartz; said major face being superficially modified by ion implantation; the direction of propagation of said elastic surface waves being selected for making minimal the first-order coefficient of the thermal drift of the oscillation frequency.

4. An oscillator as claimed in claim 1, wherein the rectilinear radiant intervals of said transducers are arranged symmetrically in relation to the axis along which said elastic surface waves are propagated at the major face of said substrate.

5. An oscillator as claimed in claim 1, wherein each of said discrete radiator elements comprises two rectilinear radiant intervals separated by a finger belonging to one of said interdigitated combs and surrounded by two successive fingers of the other of said interdigitated combs.

6. An oscillator as claimed in claim 5, wherein the comb carrying the fingers surrounding said rectilinear radiant intervals is connected to a ground terminal of said oscillator.

7. An oscillator as claimed in claim 1, wherein said first and second interdigitated comb transducers are arranged in the immediate proximity of one another and are electrostatically decoupled by an intermediate conductive band connected to a ground terminal of said oscillator.

8. An oscillator as claimed in claim 7, wherein the closest end fingers belonging respectively to the combs of said first and second transducers are electrically connected to said ground terminal for reducing the influence of the interelectrode capacitances of said feedback loop.

9. An oscillator as claimed in claim 8, wherein said end fingers are connected to comb spines lying respectively on the opposite sides of the axis along which said elastic surface waves are propagated.

10. An oscillator as claimed in claim 1 wherein said third interdigitated comb transducer has rectilinear fingers, said fingers being separated by a distance of one eighth of the wavelength of said vibratory energy in order to reduce reflections.

11. An oscillator as claimed in claim 1 wherein said piezoelectric substrate has another major face, opposite said major face on which said first and second transducers are arranged, said another major face having a sandblasted surface for overcoming parasitic signals.

* * * * *